(12) United States Patent
Chanda et al.

(10) Patent No.: US 8,716,071 B2
(45) Date of Patent: May 6, 2014

(54) METHODS AND SYSTEMS INVOLVING ELECTRICALLY REPROGRAMMABLE FUSES

(71) Applicant: International Business Machines Corporation, Armonk, NY (US)

(72) Inventors: Kaushik Chanda, Fishkill, NY (US); Lynne M. Gignac, Yorktown Heights, NY (US); Wai-Kin Li, Hopewell Junction, NY (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/775,570

(22) Filed: Feb. 25, 2013

(65) Prior Publication Data

US 2013/0176805 A1    Jul. 11, 2013

Related U.S. Application Data

(60) Division of application No. 12/688,254, filed on Jan. 15, 2010, which is a continuation of application No. 11/839,716, filed on Aug. 16, 2007, now abandoned.

(51) Int. Cl.
*H01L 21/82* (2006.01)

(52) U.S. Cl.
USPC ........... 438/132; 438/215; 438/281; 438/333; 438/467; 438/601; 257/529; 257/751; 257/758; 257/E23.147; 257/E23.149; 361/626; 361/628; 361/642

(58) Field of Classification Search
None
See application file for complete search history.

(56) References Cited

U.S. PATENT DOCUMENTS

| | | | |
|---|---|---|---|
| 6,100,116 A | 8/2000 | Lee et al. |
| 6,100,118 A | 8/2000 | Shih et al. |
| 6,407,453 B1 | 6/2002 | Watanabe et al. |
| 6,433,404 B1 | 8/2002 | Iyer et al. |
| 6,444,503 B1 | 9/2002 | Yu |
| 6,492,207 B2 | 12/2002 | Bouldin et al. |
| 6,555,458 B1 | 4/2003 | Yu |
| 6,617,234 B2 | 9/2003 | Wang et al. |
| 6,624,499 B2 | 9/2003 | Kothandaraman et al. |
| 6,633,055 B2 | 10/2003 | Bertin et al. |
| 6,746,947 B2 | 6/2004 | Daubenspeck et al. |
| 6,753,210 B2 | 6/2004 | Jeng et al. |
| 6,831,349 B2 | 12/2004 | Chuang |
| 6,835,642 B2 | 12/2004 | Yang et al. |

(Continued)

FOREIGN PATENT DOCUMENTS

EP    0981161 A2    2/2000

*Primary Examiner* — Zandra Smith
*Assistant Examiner* — Khanh Duong
(74) *Attorney, Agent, or Firm* — Cantor Colburn LLP; Ian MacKinnon

(57) ABSTRACT

An electrically reprogrammable fuse comprising an interconnect disposed in a dielectric material, a sensing wire disposed at a first end of the interconnect, a first programming wire disposed at a second end of the interconnect, and a second programming wire disposed at a second end of the interconnect, wherein the fuse is operative to form a surface void at the interface between the interconnect and the sensing wire when a first directional electron current is applied from the first programming wire through the interconnect to the second programming wire, and wherein, the fuse is further operative to heal the surface void between the interconnect and the sensing wire when a second directional electron current is applied from the second programming wire through the interconnect to the first programming wire.

4 Claims, 9 Drawing Sheets

(56) References Cited

U.S. PATENT DOCUMENTS

| | | |
|---|---|---|
| 7,009,222 B2 | 3/2006 | Yang |
| 7,075,127 B2 | 7/2006 | Kothandaraman et al. |
| 7,247,555 B2 | 7/2007 | Cong et al. |
| 7,298,639 B2 * | 11/2007 | Hsu et al. .................. 365/96 |
| 7,411,818 B1 | 8/2008 | Elmegreen et al. |
| 7,517,736 B2 | 4/2009 | Mehta et al. |
| 7,659,168 B2 * | 2/2010 | Hsu et al. .................. 438/281 |
| 7,662,674 B2 * | 2/2010 | Maiz et al. .................. 438/132 |
| 7,671,444 B2 * | 3/2010 | Wang et al. .................. 257/529 |
| 7,821,041 B2 * | 10/2010 | Chung et al. .................. 257/209 |
| 2006/0249808 A1 | 11/2006 | Hsu et al. |

* cited by examiner

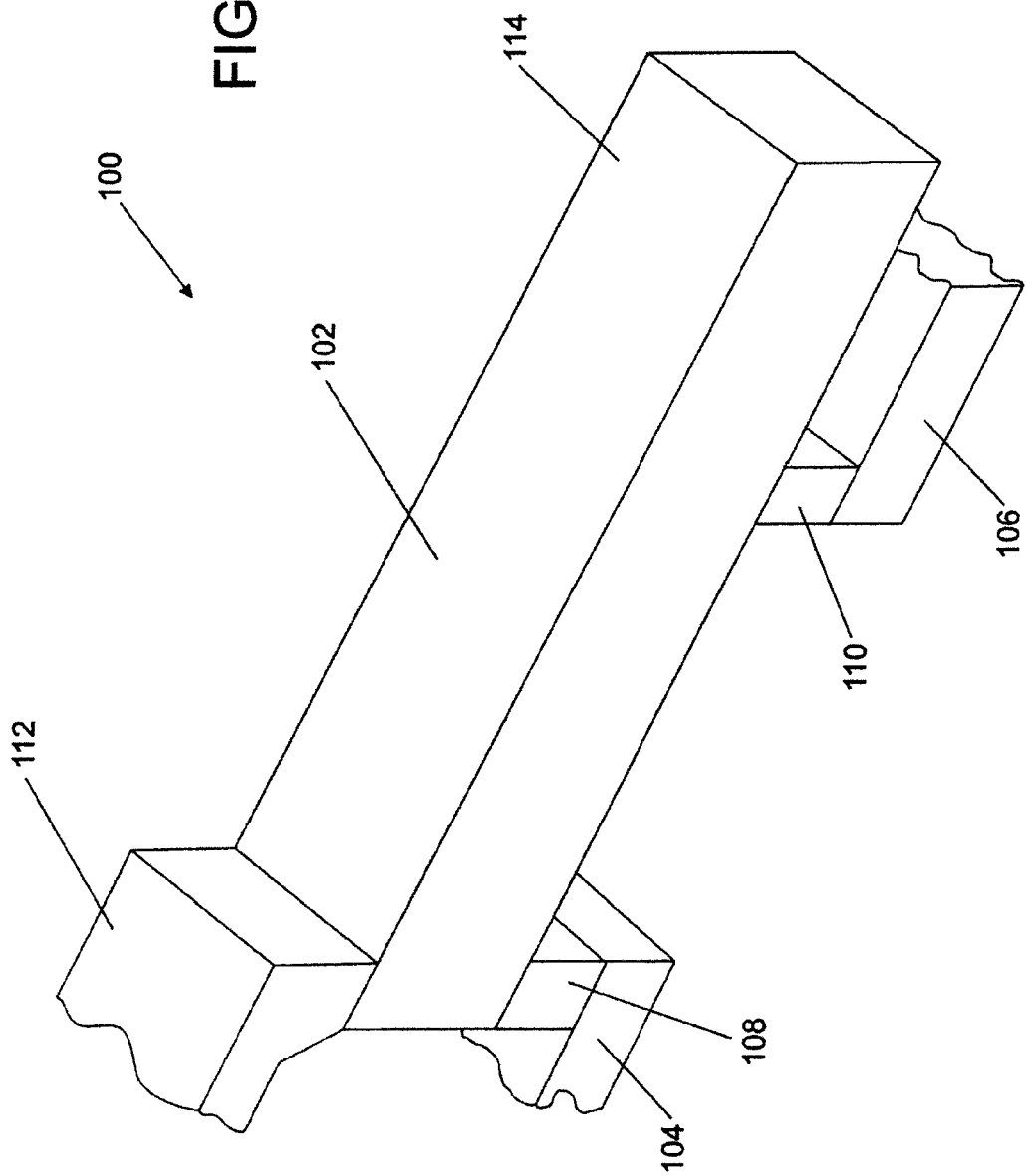

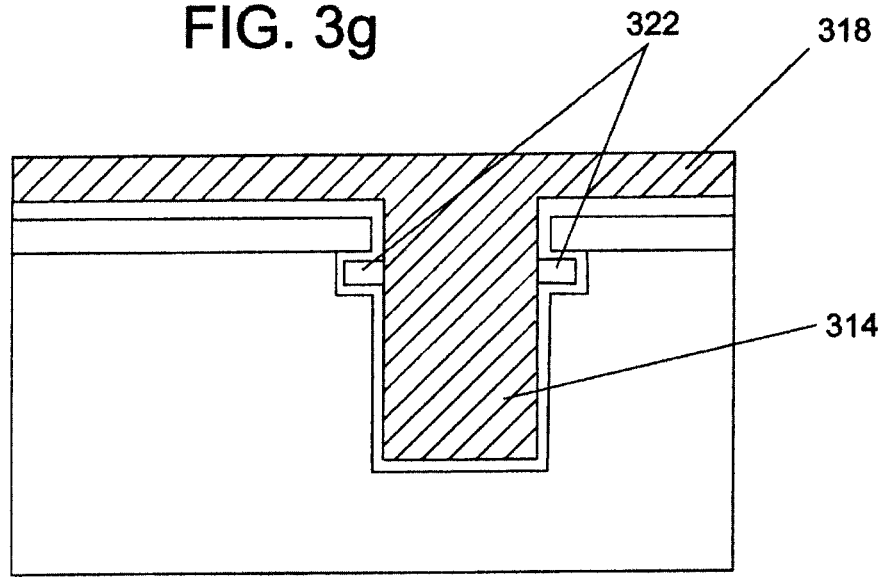
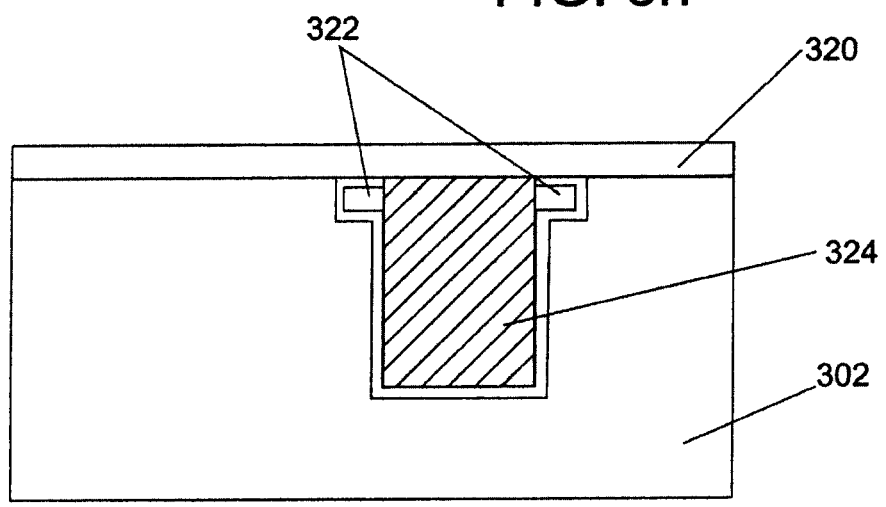

METHODS AND SYSTEMS INVOLVING ELECTRICALLY REPROGRAMMABLE FUSES

CROSS-REFERENCE TO RELATED APPLICATIONS

This application is a divisional of application Ser. No. 12/688,254, filed Jan. 15, 2010, which is a continuation of prior application Ser. No. 11/839,716, filed Aug. 16, 2007, each of the disclosures of which are incorporated by reference herein in its entirety.

FIELD OF THE INVENTION

This invention relates to semiconductor fuses, and particularly to electrically programmable semiconductor fuses.

BACKGROUND

Electrically programmable fuses (efuses) used in re-routing circuits are programmed using a high electron current that induces a large gap in the conducting silicide layer. The programming uses a large power density in a short period of time. The result is a permanent resistance shift in the efuse that is not easily controlled and cannot be reversed.

BRIEF SUMMARY

The shortcomings of the prior art are overcome and additional advantages are provided through the provision of an electrically reprogrammable fuse comprising an interconnect disposed in a dielectric material, a sensing wire disposed at a first end of the interconnect, a first programming wire disposed at a second end of the interconnect, and a second programming wire disposed at a second end of the interconnect, wherein the fuse is operative to form a surface void between the interconnect and the sensing wire when a first directional electron current is applied from the first programming wire through the interconnect to the second programming wire, and wherein, the fuse is further operative to heal the surface void between the interconnect and the sensing wire when a second directional electron current is applied from the second programming wire through the interconnect to the first programming wire.

An exemplary method for fabricating an electrically programmable fuse includes developing a first photoresist of a fuse mask on a hardmask of a substrate, etching through the hardmask, etching to form an undercut portion below the hardmask, developing a second photoresist of the fuse mask on the hardmask, etching to form a trench in the substrate, depositing a liner in the trench, seeding the trench, and electroplating the trench.

An exemplary method for programming and reprogramming an electrically reprogrammable fuse includes programming the electrically reprogrammable fuse by inducing an electron current from a first programming wire through an interconnect to a second programming wire operative to effect electromigration in the interconnect, such that a void is formed between the interconnect and a sensing wire, and reprogramming the electrically reprogrammable fuse by inducing an electron current from the second programming wire through the interconnect to the first programming wire operative to effect electromigration in the interconnect, such that the interconnect contacts the sensing wire.

An alternate exemplary method for fabricating an electrically programmable fuse includes developing a first photoresist of a fuse mask on a hardmask of a substrate, wherein a sacrificial layer is disposed between the hardmask and the substrate, etching through the hardmask and the sacrificial layer, etching the sacrificial layer to form an undercut portion below the hardmask, developing a second photoresist of the fuse mask on the hardmask, etching to form a trench in the substrate, depositing a liner in the trench, seeding the trench, electroplating the trench, polishing the electroplate overburden, and depositing a cap material.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1a illustrates a perspective view of one example of an efuse.

FIG. 1b illustrates a side view of the efuse of FIG. 1a.

FIGS. 3a-3h illustrate one example of a method for fabricating an efuse.

Figure 1B:
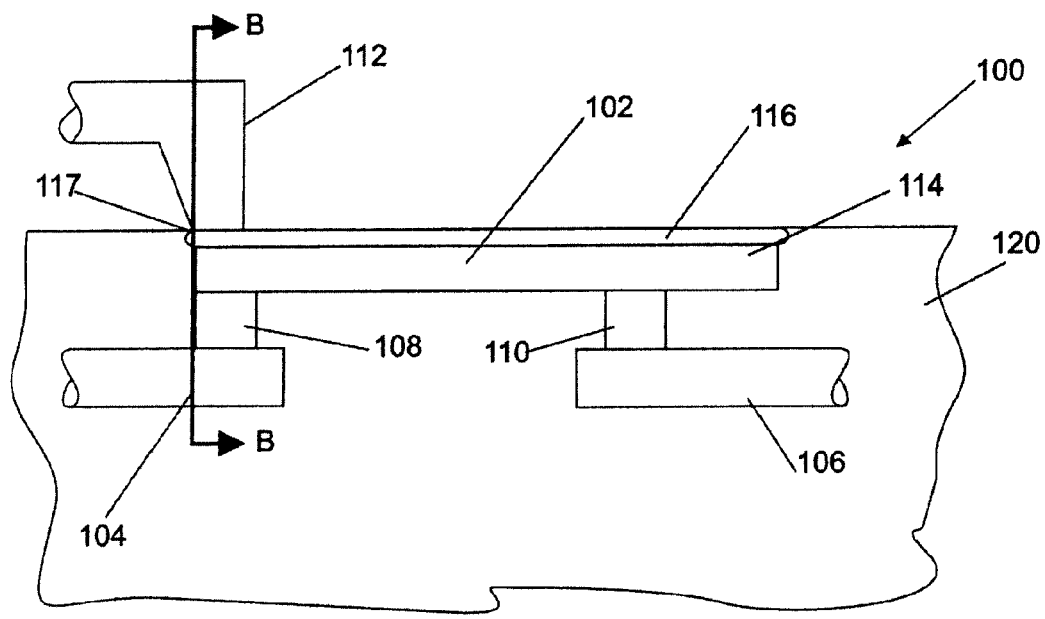

The detailed description explains the preferred embodiments of the invention, together with advantages and features, by way of example with reference to the drawings.

DETAILED DESCRIPTION

Systems and methods involving electrically reprogrammable fuses are provided. Several exemplary embodiments are described.

In this regard, an efuse may be used to re-route circuits in semiconductors. For example, typical semiconductors include logic etched permanently on a chip. However, efuses may dynamically reprogram semiconductor chips while they are in use.

Existing efuses may include poly-silicon stripes with a thin layer of silicide covering the top of the stripes. Programming these efuses requires passing a pulse of high electron current through the efuse. The pulse of the electron current induces a large gap in the conducting silicide layer caused by the electromigration of atoms in the metal. The resistance of the poly-silicon stripe shifts from about 100 ohms to 1 kohm or greater in the programmed efuse. The amount of resistance shift using this type of efuse cannot be easily controlled because the programming process uses a large amount of power density in a short period of time (approximately 1 msec, for example). The programming is also not reversible.

Thus, it is desirable for the resistance shift induced by programming an efuse to be set more accurately. Additionally it is desirable to allow the reversible programming of efuses. The embodiments described below allow for the reversible programming of efuses that may be set to a resistance value more accurately than previous embodiments.

FIG. 1a illustrates a perspective view of an exemplary embodiment of an efuse 100. The efuse 100 includes an interconnect 102 and studs 108 and 110 (e.g. tungsten carbide) disposed between two poly-silicon programming wires 104 and 106 respectively. In the illustrated embodiment, the interconnect 102 is copper. However, the interconnect 102 may alternatively include any of a variety of metals including a combination of metals. A sensing wire 112 contacts the interconnect 102. Extension 114 of the interconnect 102 may be included as a reservoir for the efuse 100.

FIG. 1b illustrates a side view of the exemplary embodiment of an efuse 100. The interconnect 102 is disposed in a dielectric substrate 120. In this embodiment, a cavity 116 has been formed in the substrate around the upper portion of the interconnect 102.

Figure 1C:
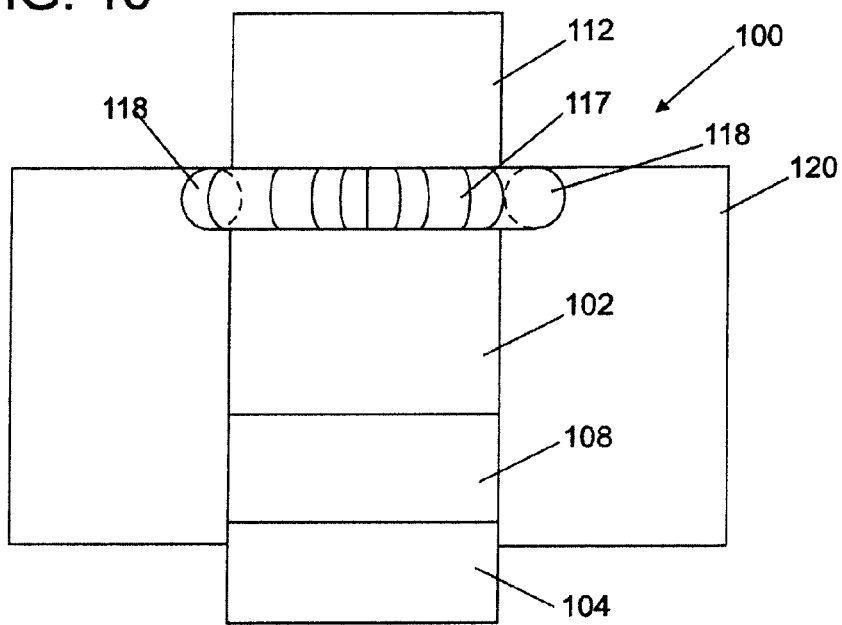
FIG. 1c illustrates a partially cut-away front view efuse of FIG. 1b, taken along the line B-B.

FIG. 1c illustrates a partially cut-away front view of the efuse 100, taken along the lines B-B in FIG. 1b. Programming wire 104 contacts stud 108. The interconnect 102 contacts the sensing wire 112. Additionally, the front portion 117 of the cavity 116 in the substrate 120, and the two sidewall cavities 118 between the interconnect 102 and the substrate 120 are illustrated.

Prior to programming the efuse 100, signals may pass from the sensing wire 112 through the interconnect 102 to a variety of circuit components. Programming physically alters the interconnect 102 increasing the resistance of the interconnect 102 such that signals cannot effectively pass through the efuse.

Figure 2A:
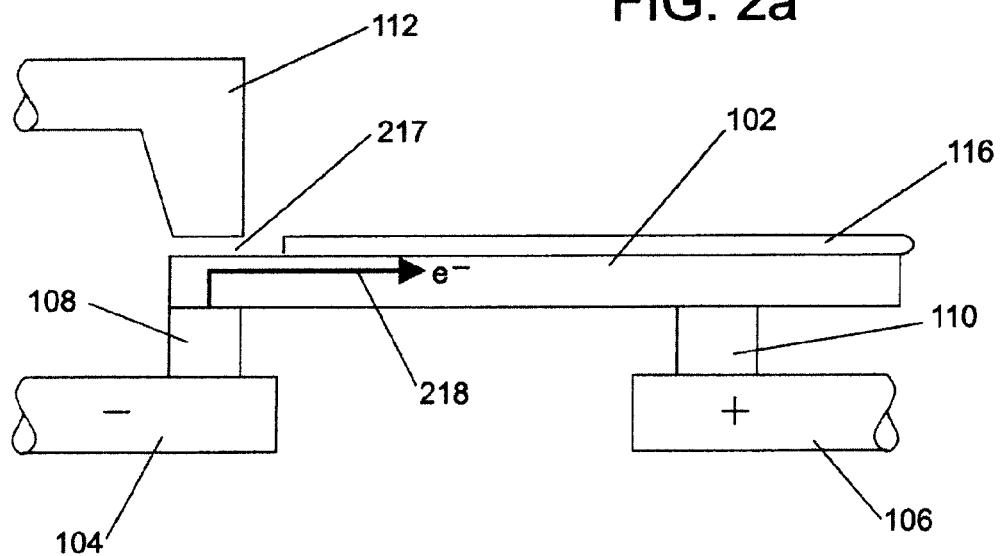
FIG. 2a illustrates an example of programming an efuse.
Figure 2B:
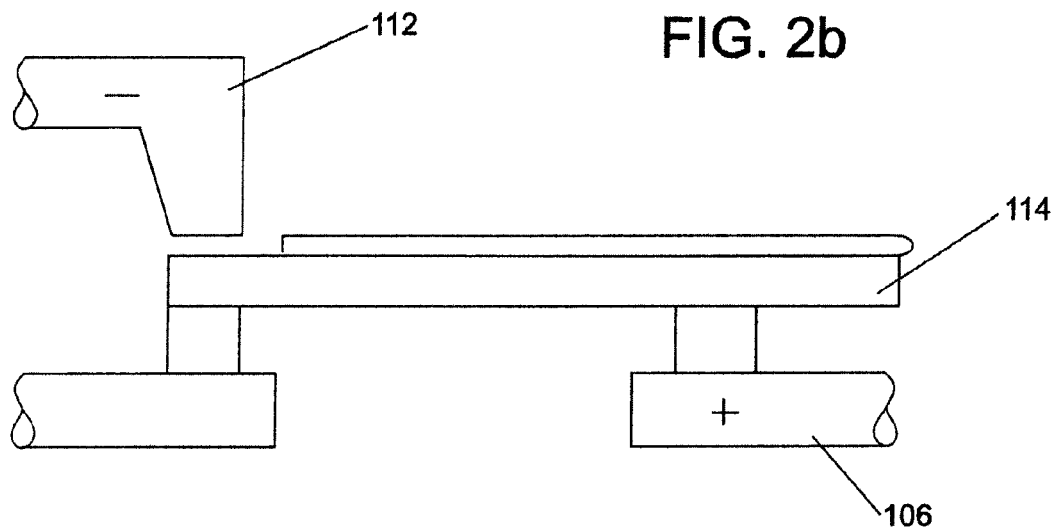
FIG. 2b illustrates an example of the sensing state of an efuse.
Figure 2C:
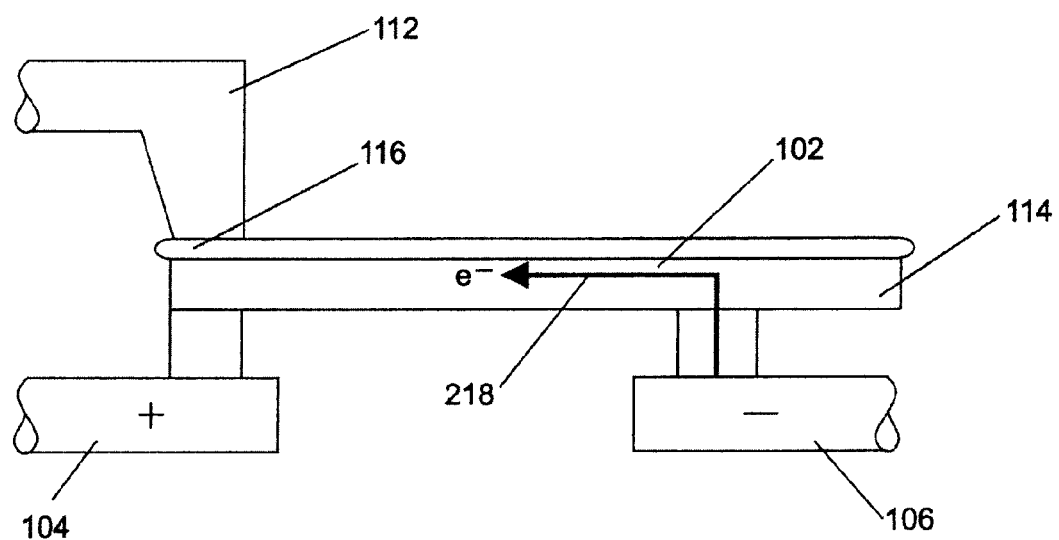
FIG. 2c illustrates an example of reversing the programming of an efuse.

The operation of the efuse is illustrated in FIGS. 2a-2c. FIG. 2a illustrates the programming of the efuse. In programming, the electron current 218 flows through the interconnect 102 from the first programming wire 104 to the second programming wire 106. The studs 108 and 110 disposed between the interconnect 102 and the programming wires 104 and 106 are conductive, and act as blocking boundaries against atom diffusion during electromigration. The electronically conductive blocking boundaries facilitate the electrical communication between the interconnect 102 and the programming wires 104 and 106 in the dielectric material 120, while preventing atoms from diffusing between the interconnect 102 and the programming wires 104 and 106. The flow of electron current 218 causes an electromigration of the metal in the interconnect 102. The flow of electrons displaces atoms in the surface of the interconnect 102 resulting in a surface void 217 forming between the interconnect 102 and the sensing wire 112. In this embodiment, sidewall cavities 116 accelerate the electromigration in the interconnect 102.

A free surface is often the fastest diffusion path during electromigration. Fabricating sidewall cavities on the top portion of an interconnect effectively creates channels with free metal surface, thereby inducing accelerated electromigration process during fuse programming. Also, the accelerated electromigration is limited to the top portion of the interconnect, resulting the fast formation of a thin void at the top interface between the interconnect 102 and the sensing wire 112 after programming. Therefore, the programming time to generate such small and thin void is minimized.

FIG. 2b shows the efuse in a sensing state. If a signal cannot pass from the sensing wire 112 through the interconnect 102 to the second programming wire 106, the efuse is effectively an open circuit.

FIG. 2c illustrates the reversing of the programming of the efuse. Reversing the bias of the programming electron current results in reversing the programming of the efuse. Thus, electron current 218 flows from the second programming wire 106 through the interconnect 102 to the first programming wire 104. This electron current flow results in the electromigration of metal atoms that fill the surface void 217. The surface void 217 is replaced by metal atoms such that a connection between the sensing wire 112 and the interconnect 102 results. Reversing the programming of the efuse effectively lowers the resistance of the interconnect 102, allowing the efuse to pass signals through the interconnect 102 to the sensing wire 112.

This embodiment includes a reservoir 114. Reservoir 114 acts as a depository for the atoms displaced during electromigration, and helps to prevent the disfigurement or extrusion of the efuse following electromigration.

Figure 3A:
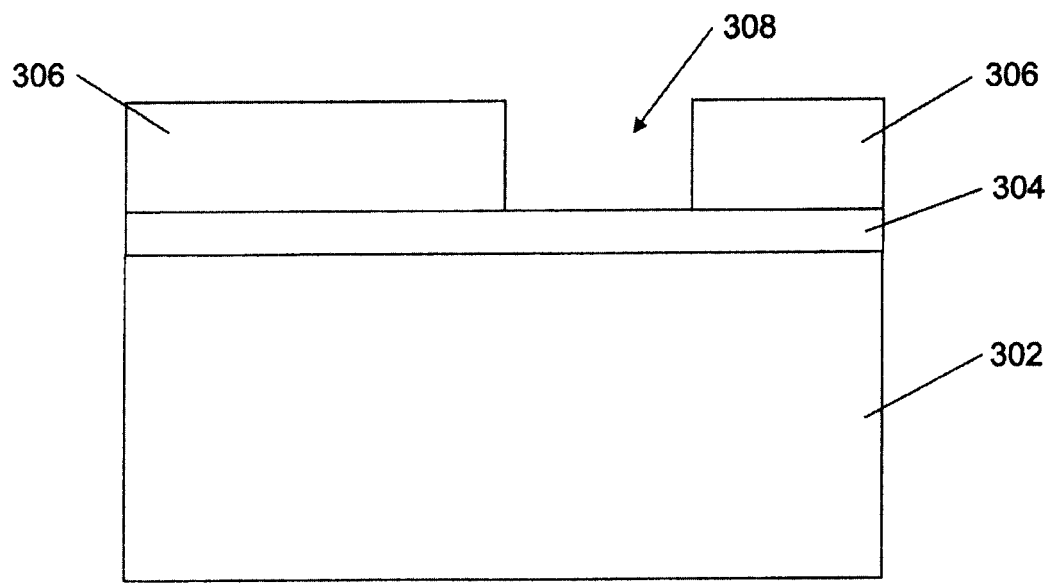

FIGS. 3a-3h illustrate a side cutaway view of the steps in an exemplary method of fabricating an efuse. Referring to FIG. 3a, substrate 302 is a dielectric material such as for example, but not limited to, $SiO_2$, $Si_3N_4$, SiCOH, silsesquioxanes, C doped oxides (i.e., organosilicates that include atoms of Si, C, O and/or H, thermosetting polyarylene ethers, SiLK (a polyarylene ether available from Dow Chemical Corporation), JSR (a spin-on silicon-carbon contained polymer material availabel from JSR Corporation), etc., or layers thereof. A hardmask 304 formed on dielectric material 302 provides mechanical protection during chemical mechanical polishing (CMP) of the semiconductor chip, and may be one of many suitable materials such as silicon nitride or silicon oxide. To fabricate the efuse, a photoresist 306 of the fuse mask is developed on the hardmask 304. The exposed portion 308 of the photoresist 306 will define the area of the efuse.

Figure 3B:
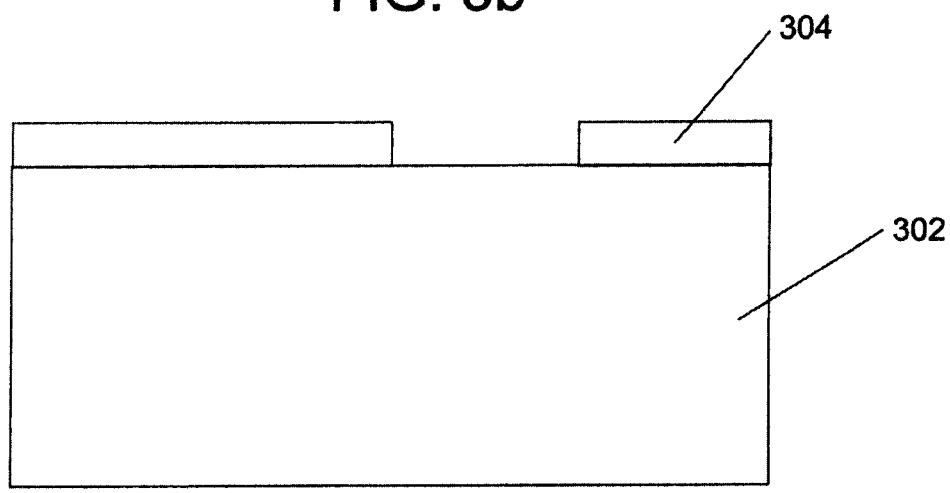

The next step in fabricating the efuse is shown in FIG. 3b. The hardmask 304 is removed in the area defined by the photoresist 306 using an etching process such as reactive ion etching (RIE).

Figure 3C:
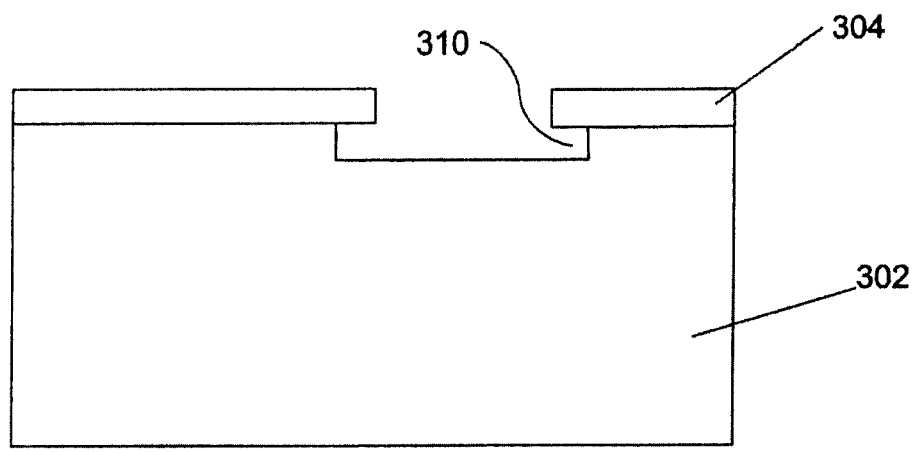

FIG. 3c illustrates the next step in the fabricating method where an undercut 310 is formed under the hardmask 304. The undercut 310 is formed using any suitable etching process. In this exemplary method, the undercut 310 is formed in the substrate 302 using a wet process isotropic etching. The undercut 310 is etched approximately, on the order of, 10 nm under the lip of the area defined by the hardmask 304 and approximately, in the order of, 10 nm in depth below the hardmask 304.

Figure 3D:
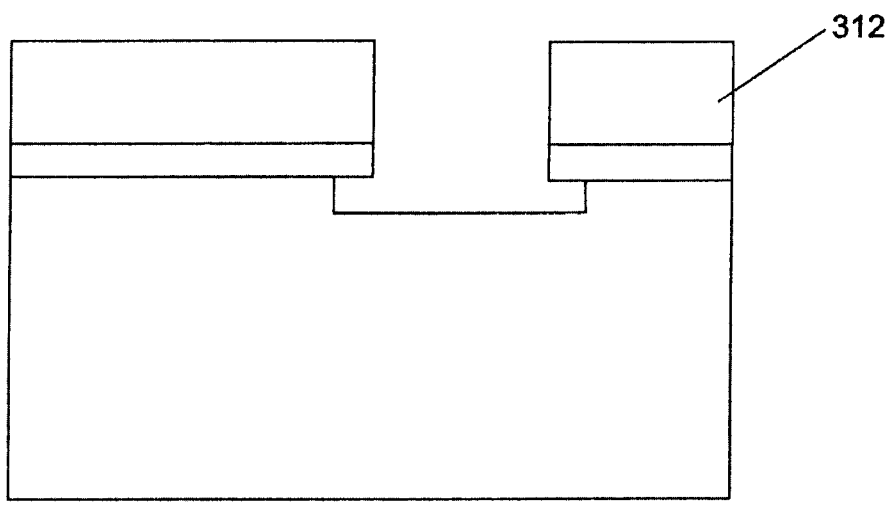
Figure 3E:
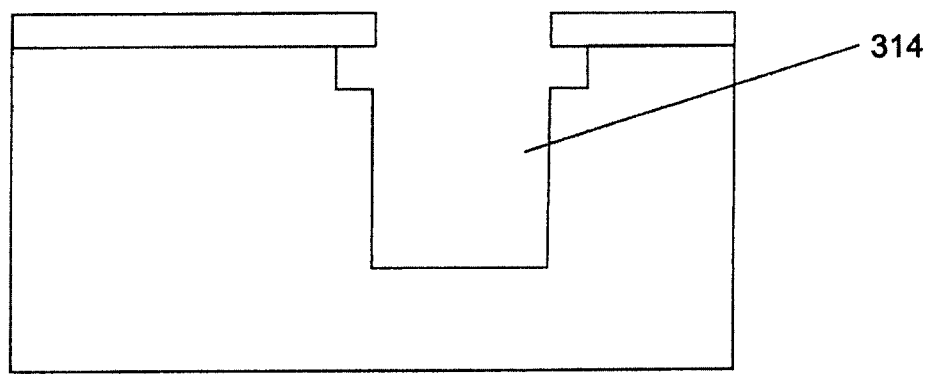

After the undercut 310 is etched in the substrate 302, a second photoresist 312 is developed on the hardmask 304 as shown in FIG. 3d. The second photoresist may be similar to the first photoresist or may be different. A trench 314 is etched in the substrate 302 using an etching process such as RIE as depicted in FIG. 3e.

Figure 3F:
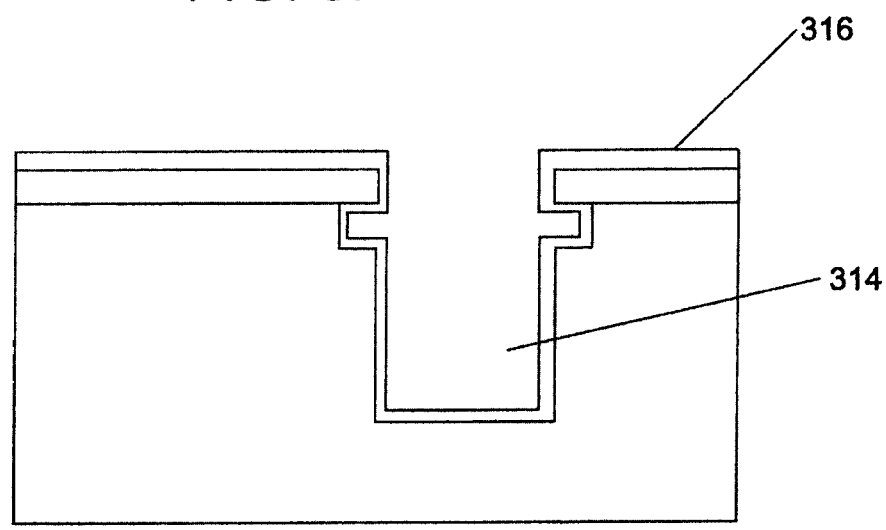

FIG. 3f shows a liner 316 that is deposited using chemical vapor deposition or physical vapor deposition, for example. Once the liner 316 is deposited, the trench 314 is seeded to prepare the trench 314 for electroplating. In this exemplary embodiment, copper is used for the seeding and electroplating, however any suitable metal may be used such as, for example, silver or aluminum. FIG. 3g illustrates the trench 314 following electroplating with copper 318. The trench 314 is filled with copper 318. Because the undercuts 310 are not electroplated with copper 318, a cavity 322 is thus formed around the upper portion of the filled trench 314.

Finally, the excess copper 318 that is not in the trench 314 (i.e., the overburden) is removed using a method such as CMP, for example, and a cap layer 320 is layered over the substrate 302. FIG. 3h shows the completed efuse including the interconnect 324 and cavities 322, with a cap layer 320.

Figure 4:
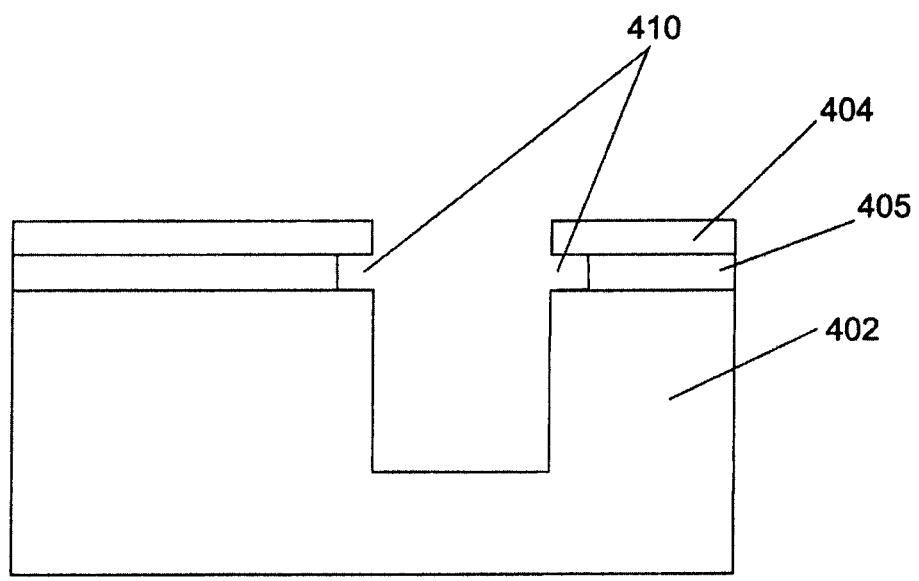
FIG. 4 illustrates one example of an alternate method for fabricating an efuse.

FIG. 4 illustrates an alternate method for fabricating an efuse. In this method, a sacrificial layer 405 is disposed between the substrate 402 and the hardmask 404. The sacrificial layer 405 may be any suitable dielectric material such as silicon oxide, for example. The sacrificial layer 405 partially defines the area of the undercut 410 during the isotropic etching step. By using a sacrificial layer 405, the isotropic etching of the undercut 410 may be limited to an area partially defined by the sacrificial layer 405, and thus, the etching may be more precise. Other than the use of a sacrificial layer 405, fabrication process for the efuse in this alternate method is similar to the fabrication method described above and shown in FIGS. 3a-3h.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for programming and reprogramming an electrically reprogrammable fuse, the method comprising:

programming the electrically reprogrammable fuse by inducing an electron current from a first programming wire through an interconnect extending along a first direction to a second programming wire operative to effect electromigration in the interconnect along a first migration direction that is parallel with the first direction to deposit displaced atoms at a reservoir, such that a void is formed between the interconnect and a sensing wire; and reprogramming the electrically reprogrammable fuse by inducing an electron current from the second programming wire through the interconnect to the first programming wire operative to effect electromigration in the interconnect along a second migration direction that is parallel with the first direction to deposit atoms from the reservoir to the void, such that the interconnect contacts the sensing wire.

2. The method for programming and reprogramming the electrically reprogrammable fuse of claim 1, wherein the method further comprises determining whether the void exists between the interconnect and the sensing wire by inducing an electron current between the sensing wire and the second programming wire.

3. The method for programming and reprogramming the electrically reprogrammable fuse of claim 2, wherein if the void is determined to not exist, repeating the programming step.

4. The method for programming and reprogramming the electrically reprogrammable fuse of claim 1, wherein atoms displaced during programming are stored in a reservoir portion of the interconnect.

* * * * *